(12) United States Patent
Chimot et al.

(10) Patent No.: US 9,929,535 B2
(45) Date of Patent: Mar. 27, 2018

(54) TUNABLE EMITTING DEVICE WITH A DIRECTLY MODULATED LASER COUPLED TO A RING RESONATOR

(71) Applicant: Alcatel Lucent, Boulogne-Billancourt (FR)

(72) Inventors: Nicolas Chimot, Marcoussis (FR); Francois Lelarge, Marcoussis (FR); Siddharth Joshi, Marcoussis (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/304,263

(22) PCT Filed: Apr. 15, 2015

(86) PCT No.: PCT/EP2015/058142
§ 371 (c)(1),
(2) Date: Oct. 14, 2016

(87) PCT Pub. No.: WO2015/158759
PCT Pub. Date: Oct. 22, 2015

(65) Prior Publication Data
US 2017/0040773 A1   Feb. 9, 2017

(30) Foreign Application Priority Data

Apr. 16, 2014  (EP) .................................. 14305568.9

(51) Int. Cl.
*H01S 5/10*  (2006.01)
*H01S 5/00*  (2006.01)
*H01S 5/026* (2006.01)
*H01S 5/06*  (2006.01)
*H01S 5/30*  (2006.01)
(Continued)

(52) U.S. Cl.
CPC ............ *H01S 5/1025* (2013.01); *H01S 5/005* (2013.01); *H01S 5/026* (2013.01); *H01S 5/0612* (2013.01); *H01S 5/1032* (2013.01); *H01S 5/1071* (2013.01); *H01S 5/12* (2013.01); *H01S 5/223* (2013.01); *H01S 5/3054* (2013.01);
(Continued)

(58) Field of Classification Search
CPC ........ H01S 5/1025; H01S 5/1071; H01S 5/34; H01S 5/223; H01S 5/12; H01S 5/3054; H01S 5/1032; H01S 5/005; H01S 5/026; H01S 5/0612; H01S 5/06251
See application file for complete search history.

(56) References Cited

U.S. PATENT DOCUMENTS 7,106,448 B1 * 9/2006 Vawter .................. G01C 19/72
356/461
2007/0110453 A1 * 5/2007 Akiyama ........... G02B 6/12004
398/182

* cited by examiner

*Primary Examiner* — Dung Nguyen
(74) *Attorney, Agent, or Firm* — Harness, Dickey & Pierce, P.L.C.

(57) ABSTRACT

An emitting device is intended for delivering photons with a chosen wavelength. This emitting device includes an InP substrate with a directly modulated laser arranged for generating photons modulated by a non-return-to-zero modulation to produce data to be transmitted, a passive ring resonator monolithically integrated with the directly modulated laser and having a resonance amongst several ones that is used for filtering a zero level induced by the data modulation, and a tuning means arranged along the directly modulated laser and/or around the ring resonator to tune the photon wavelength and/or the ring resonator resonance used for filtering.

11 Claims, 1 Drawing Sheet

(51) Int. Cl.
  *H01S 5/12*    (2006.01)
  *H01S 5/223*   (2006.01)
  *H01S 5/34*    (2006.01)
  H01S 5/0625   (2006.01)
(52) U.S. Cl.
  CPC ............ *H01S 5/34* (2013.01); *H01S 5/06251* (2013.01); *H01S 5/06255* (2013.01)

TUNABLE EMITTING DEVICE WITH A DIRECTLY MODULATED LASER COUPLED TO A RING RESONATOR

CROSS-REFERENCE TO RELATED APPLICATIONS

This application is the U.S. National Phase application of PCT Application No. PCT/EP2015/058142 filed on Apr. 15, 2015, which claims priority to European Patent Application No. 14305568.9 filed on Apr. 16, 2014, the entire contents of each of which are incorporated herein by reference.

FIELD OF THE INVENTION

The present invention relates to tunable emitting devices that can be notably used in optical access networks.

BACKGROUND

As known by the man skilled in the art there is an increasing demand for a high transmission reach in optical access networks, typically 40 km or even 60 km, in order to get downstream and upstream nominal line rates per channel equal to 10 Gb/s and 2.5 Gb/s or 10 Gb/s respectively.

There is also a demand for high dynamic extinction ratio (or DER), typically 6 dB or even 8 dB.

Several solutions have been proposed to reach at least one of the above mentioned characteristics.

A first solution consists in carrying out a proper management of chirp and spectrum reshaping. This first solution is rather well adapted to reach intermediate distances (typically between 100 km and 300 km) and/or to allow reducing the spectral broadening through dual modulation. But it induces a DER that is too low.

A second solution consists in using an electro-absorption modulator (or EML). But it induces a loss of optical power due to the absorption into the modulator. To improve the situation it is possible to use a passive taper section and to grow different materials for the laser and the modulator. But this increases the technology complexity and leads to a high consumption 3-sections device.

A third solution consists in using an integrated chirp managed laser (or CML) with an optical spectrum re-shaper to increase dispersion tolerance, However, the targeted transmission distance ranges (from 200 km to 600 km) are far beyond the optical access network standards. Beside, this solution makes necessary to precisely tune the laser wavelength to the optical spectrum re-shaper characteristic, which requires the use of a complex feedback loop that makes it viable for very long distance networks but unsuitable for low cost applications.

A fourth solution consists in using a transmitter optical sub-assembly (or TOSA) with an hybrid integration of directly modulated lasers (or DML) and free-space-optics assembly for signal spectral filtering. This solution fully fits to the distance transmission and DER requirements, but its main drawback is the complexity of the module packaging since a precise alignment of the on-wafer laser with the free-space-optics is required, which induces additional coupling losses that could be a limitation for a stringent optical budget recommendation in an optical access network. Moreover, the achieved performances are only possible by means of a complex and power consuming electronic dispersion compensation (or EDC) system.

A fifth solution consists in using a planar ligthwave circuit (or PLC). This allows achieving a 300 km transmission at 10 Gb/s without any optical or electrical dispersion compensation. However, the fabrication and use appear to be complex since two monitor port photodiodes are requested and high insertion losses are expected from the hybrid integration of III-V semiconductor based laser on silicon platform.

SUMMARY

So an object of this invention is to improve the situation, and notably to allow data transmission over at least 40 km of a single mode fiber (or SMF) with an extinction ratio higher than 6 dB and high output power (or high optical budget).

In an embodiment, an emitting device is intended for delivering photons with a chosen wavelength, and comprises:

- an InP substrate with a directly modulated laser (or DML) arranged for generating photons modulated by a (typical) non-return-to-zero (or NRZ) modulation to produce data to be transmitted, the active structure of the directly modulated laser being epitaxially grown on the InP substrate,
- a passive ring resonator being defined in a passive section of the InP substrate, said passive ring resonator being monolithically integrated with said directly modulated laser by carrying out a p-doped re-growth both in the active and passive sections of the InP substrate followed by a hydrogenation of the passive section of the InP substrate for rendering the p-doping of the re-growth inactive, said passive ring resonator having a resonance amongst several ones that is used for filtering a zero level induced by the data modulation, and
- a tuning means arranged along this directly modulated laser and/or around this ring resonator to tune the photon wavelength and/or the ring resonator resonance used for filtering.

This allows producing a simple, low cost and low consumption device that is compatible with existing packaging solutions, such as a transistor outline-can (or TO-can) module.

The tunable emitting device may include additional characteristics considered separately or combined, and notably:

- its ring resonator may be butt-joined to its directly modulated laser, in order to reduce insertion losses;
- in a first embodiment its tuning means may comprise heating electrodes arranged along its directly modulated laser and/or around its ring resonator and defining a Peltier heater;
- in a second embodiment its tuning means may comprise a controlled phase-shift section defined into its directly modulated laser;
- its directly modulated laser may be made of multi-quantum wells or quantum dashes active layers combined with an optimized buried ridge stripe (or BRS) technology, in order to get a low electrical bandwidth;
- its directly modulated laser may have an adiabatic chirp comprised between approximately 1 GHz and 8 GHz;
- it may further comprise a first semiconducting optical amplifier (or SOA) defined inside its ring resonator to modify optical losses and arranged for adjusting an on/off ratio characteristic and a steepness slope characteristic to modify optical losses. This can be done without extra technological step since the SOA material can be the same as the one of the directly modulated laser. The on/off ratio characteristic is the contrast value between the maximum of transmission and the minimum down in each resonance of the transfer function of the ring resonator;

it may further comprise a passive taper section after its ring resonator;

it may further comprise an integrated photodiode defined upward its directly modulated laser and arranged for monitoring optical power;

it may further comprise a second semiconducting optical amplifier defined downward its ring resonator and arranged for compensating optical losses.

Yet another embodiment comprises a process for producing an emitting device comprising the following steps:

performing an epitaxial growth of the active structure of the directly modulated laser on the InP substrate, carrying out a butt-joint in order to allow growth of the passive structure of a passive ring resonator, defining a Bragg array into the active structure of the directly modulated laser in order to define a directly modulated laser of DFB type, defining active and passive bands, a waveguide with a ring shape being part of the passive ring resonator and a waveguide coupling the directly modulated laser to the passive ring resonator, said waveguide being tangent to the passive ring resonator, carrying out a p-doped re-growth both in the active and passive sections, defining metallic contacts for the directly modulated laser, defining metallic heating electrodes near the passive ring resonator, performing a hydrogenation of the passive section for rendering the p doping of the re-growth inactive.

BRIEF DESCRIPTION OF THE FIGURES

Some embodiments of a tunable emitting device are now described, by way of example only, and with reference to the accompanying drawings, in which.

DESCRIPTION OF EMBODIMENTS

Hereafter is notably disclosed a tuning emitting device 1 intended for delivering photons with a chosen wavelength.

This tuning emitting device 1 may be part of an optoelectronic component, such as a transistor outline-can (or TO-can) module, for instance. Generally speaking, it may be used in optical access networks, such as Passive Optical Networks (or PONs) and especially, but not limitatively, in next generation PONs, and notably XG-PON1 or NG-PON ("N Gigabits-PON"), for instance.

Figure 1:
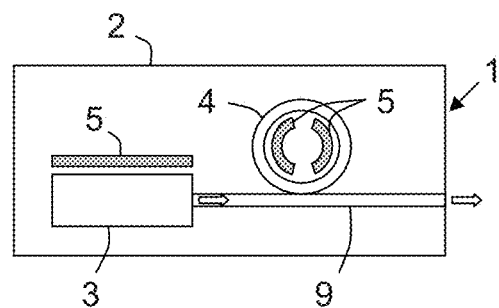
FIG. 1 schematically illustrates, in a top view, a first example of embodiment of a tuning emitting device, and FIG. 2 schematically illustrates, in a top view, a second example of embodiment of a tuning emitting device.
Figure 2:
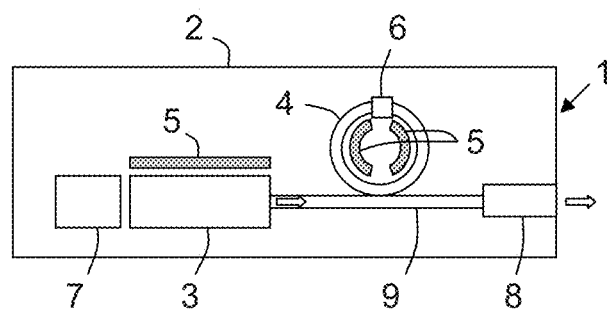

Examples of tuning emitting devices 1 according to embodiments of the invention are schematically illustrated in FIGS. 1 and 2. As illustrated in these non-limiting examples, a tuning emitting device 1 comprises an InP substrate 2 with at least a directly modulated laser (or DML) 3, a passive ring resonator 4, and a tuning means.

The directly modulated laser (or DML) 3 is defined onto the InP substrate 2 and arranged for generating photons modulated by a (typical) non-return-to-zero (or NRZ) modulation to produce data to be transmitted. So, the data modulation written on the optical power generated by the DML 3 is made by a sequence of "one" and "zero".

The DML 3 presents a very efficient damping of the resonance frequency and, as a consequence, presents a low transient chirp (typically <2 GHz). It is a major concern since transient chirp is very detrimental for data transmission over single mode fiber (or SMF).

In order to reduce the transient chirp, the DML 3 can be made of multi-quantum wells (or MQWs) or quantum dashes (or Washes) active layers combined with an optimized buried ridge stripe (or BRS) technology, to get a low electrical bandwidth.

Preferably, the DML 3 is arranged in order to show an adiabatic chirp comprised between approximately 1 GHz and approximately 8 GHz, and possibly between 1 GHz and 5 GHz. This interval of values allows to run easily the DML 3 with the ring resonator 4. The larger the adiabatic chirp is, the lower the resonance slope has to be in order to get a similar extinction ratio value.

The passive ring resonator 4 is defined onto the InP substrate 2 in a passive section, monolithically integrated with the DML 3, and having a resonance amongst several ones that is used for filtering a zero level induced by the data modulation.

In other words, when the sequence of "one" and "zero" passes through the filter (i.e. the ring resonator 4), each "one" level is less attenuated than a "zero" level, which induces an increase of the contrast between the two levels and therefore allows the zero level to be filtered by the ring resonator 4.

This coupling is done via a waveguide 9 that is defined onto the InP substrate 2 in a passive section, fed with photons by the DML 3, and tangent to the ring resonator 4.

Preferably, this ring resonator 4 is butt-joined to the DML 3 in a passive material, in order to reduce insertion losses. Indeed, the waveguide 9 and the ring resonator 4 must present the lowest losses as possible to keep a high optical power. To do that, they have to be designed in a passive material, which means a material that doesn't absorb the optical power (typically with a higher bandgap energy semiconductor).

It is important to note that the ring resonator 4 is only used to filter the zero level induced by standard non-return to zero modulation, by means of a resonance, in order to increase the dynamic extinction ratio (or DER) rather than compensating the fiber dispersion. The latter would require a too fine tuning of the etalon and a complex feedback loop as in the CML third solution of the art. The filtering operation of the ring resonator 4 is tributary to the steepness of its characteristic slope, which is preferably comprised between 1 GHz and 6 GHz, and if possible between 1 GHz and 4 GHz, to be compatible with the adiabatic chirp of the DML 3 and the fiber lengths in an optical access network.

It is also important to notice that the DML 3 and the ring resonator 4 operate together in close combination to optimize the photon transmission.

The tuning means 5 is defined onto the InP substrate 2 and arranged along the DML 3 and/or around the ring resonator 4 to tune the photon wavelength and/or the ring resonator resonance used for filtering.

The last sentence means that the tuning means 5 is either arranged along the DML 3 to tune the photon wavelength while taking into account the non-tunable filtering carried out by the ring resonator 4, or arranged along the ring resonator 4 to tune the filtering while taking into account the non-tunable wavelength of the photons generated by the DML 3, or else arranged along the DML 3 and around the ring resonator 4 to tune not only the photon wavelength but also the filtering. Using together the tuning means is less attractive in terms of simplicity and cost reduction since two different electrodes have to be used.

As illustrated in the non-limiting examples of FIGS. 1 and 2, the tuning means 5 may comprise heating electrodes arranged along the DML 3 and/or around the ring resonator 4 and defining a Peltier heater.

A thermally tuned ring resonator may comprise integrated resistors, defined on top of it and defining the heating electrodes, and a conductive layer defined above the integrated resistors and intended for being fed with a current that is arranged for inducing a thermal activity of its associated integrated resistors. The resonance wavelength of the ring resonator 4 is directly linked to the perimeter of the ring. As the refractive index of the waveguide material changes with temperature, the filtering (i.e. the resonance) can be adjusted by free carrier injection using metal thin film resistors.

For instance, with a typical value of 100 Ω of a resistive heating electrode 5, a power consumption typically equal to 300 mW is required to shift the DML wavelength of 1 nm when the heating electrode 5 is placed 20 μm away from the DML 3. It is possible, if the DML 3 is tuned, to increase the width and/or the thickness of the resistive heating electrode 5 or to move it further from the DML 3 to increase the current step for a 0.1° C. shift or, if the ring resonator 4 is tuned, to heat only a small angular section of it.

But in a variant not illustrated, the tuning means 5 may comprise a controlled phase-shift section defined into the DML 3. This phase shift section may be typically made of passive material in which current is injected to create a carrier plasma which results in an index change and consequently a wavelength change.

The heating electrodes 5 as the phase-shift section require(s) only few milliamperes to provide the requested tuning (typically less than approximately 33 GHz for a 400 μm radius (of the ring resonator 4)). It is recalled that the wavelength difference between ring resonator resonances is a function of the ring perimeter (typically 33 GHz for 400 μm radius). So, the resonances being periodic, the maximum shift of the resonance or of the laser wavelength is the free spectral range (i.e. the period of the resonances) in order to recover the right laser wavelength/resonance positioning.

One or more additional elements may be optionally added to the emitting device 1 to optimize the optical eye reshaping for data transmission.

For instance and as illustrated in FIG. 2, when a more stringent control of performances is required, the emitting device 1 may further comprise a first semiconducting optical amplifier (SOA) 6 defined inside the ring resonator 4 to modify the optical losses. Its function is thereby to adjust the on/off ratio characteristic and the steepness slope characteristic of the ring resonator 4, to optimize the transmission. The on/off ratio characteristic is the contrast value between the maximum of transmission and the minimum down in each resonance of the transfer function of the ring resonator 4.

This optional first SOA 6 can be advantageously defined without extra technological step since the SOA material can be the same as the one used for defining the DML 3.

It should be also noted that a passive taper section can be also optionally defined in the emitting device 1 after the ring resonator 4. Its function is to expand the optical mode guided in order to reduce its divergence and improve the coupling with a fiber for instance so as to reduce the insertion losses. It is simply made by progressively reducing the width of the waveguide to force the mode to move down and to expand.

Also for instance and as illustrated in FIG. 2, the emitting device 1 may optionally comprise an integrated photodiode 7 defined upward the DML 3 and arranged for monitoring optical power if required. This optional rear photodiode 7 can be advantageously defined without extra technological step since the photodiode material can be the same as the one used for defining the DML 3.

Also for instance and as illustrated in FIG. 2, the emitting device 1 may optionally comprise a second semiconducting optical amplifier (or SOA) 8 defined downward the ring resonator 4 and before the output, and arranged for compensating optical losses. This optional second SOA 8 can be also advantageously defined without extra technological step since the SOA material can be the same as the one used for defining the DML 3.

When the emitting device 1 comprises a second SOA 8 and a taper section, the latter is defined just after (or downward) the second SOA 8.

The simple configuration of the emitting device 1 is of great interest, notably for a production activity for which costly screening steps have to be avoided. Indeed, the qualification of components on a full wafer can be done only with the use of simple measurements. For instance, the qualification of a single DML requires evaluating the laser wavelength, the threshold current, the optical power, the Side Mode Suppression Ratio (or SMSR) through simple static characterizations, which can be easily carried out with the emitting device 1. Indeed, the DML screening can be measured at the output of the emitting device 1 or even at the rear facet of the emitting device 1, the ring resonator screening can be done through a simple tuning current evaluation since the issue of laser wavelength stringent positioning can be reduced to a power adjustment and thus an evaluation of a power variation, the ring resonator peaks can be accurately identified by a static power measurement and so does the tuning current by recovering the variation of power previously evaluated in real transmission experiments. In any case, the tuning current is limited to a low value since the ring resonator response is periodic (around 33 GHz for a 400 μm radius). Therefore, the laser wavelength variation over the full wafer (less than +/−0.1 nm) and the absolute position of the ring resonator peaks can always be made up for by the tuning operation and the periodicity of the resonance peaks of the ring resonator 4, which makes the emitting device 1 tolerant to any variation of the effective index.

For instance, the emitting device 1 may be produced by implementing the process described below.

A first step of the process consists in an epitaxial growth of the active structure of the DML 3 on the InP substrate 2. For instance, MQW or quantum boxes are grown.

A second step of the process consists in carrying out a butt-joint in order to allow growth of the passive structure. To this effect one may first lay down a dielectric layer on top of the active structure, and then one may implement a lithographic step to define locations where holes, intended for receiving the passive structure, must be defined. Then the active structure is etched, for instance by reactive ion etching (or RIE) or inductively coupled plasma (or ICP) or chemical etching, to define these holes, and the passive structure is defined by epitaxy into the etched holes. Finally the remaining part of the dielectric layer is retrieved.

A third step of the process consists in defining, for instance, a Bragg array into the active structure to define a DML 3 of the Distributed Feedback (DFB) type.

A fourth step of the process consists in defining active and passive bands, and notably the waveguide with a ring shape, that is part of the ring resonator 4, and the waveguide 9, coupling the DML 3 to the ring resonator 4 and tangent to the latter (4). Typical distances between the waveguide and the ring resonator 4 are 100 nm to 1000 nm.

A fifth step of the process consists, for instance, in carrying out a p-doped re-growth both in the active and passive sections. This requires a precise control of the re-growth parameters to get an optimal growth morphology around the waveguide part of the ring resonator 4 for specific critallographic orientations.

A sixth step of the process consists in defining metallic contacts for the DML 3.

A seventh step of the process consists, for instance, in defining the metallic heating electrodes 5 near the ring resonator 4. This requires a precise calibration of the electrical resistance of these metallic heating electrodes 5 to get the appropriate heating of the ring for a given dissipated electrical power.

A eighth step of the process consists, for instance, in an hydrogenation of the passive section for rendering the p doping of the re-growth inactive. This requires a precise calibration of the dosage, time and hydrogenation power, in order to limit absorption losses of the optical mode inside the ring resonator 4.

In the emitting device 1 provided by the process described above, the directly modulated laser 3 is an active structure being epitaxially grown in an active section of the InP substrate while the ring resonator 4 is a passive structure being defined in a passive section of the InP substrate and being monolithically integrated with said directly modulated laser 3.

This invention offers several advantages, amongst which:
- a simple tuning means to facilitate the optimization of transmission into an optical fibre and of an eventual screening for a production phase,
- a reduction of the optical coupling losses through full integration of a DML and a ring resonator (with a butt-coupling or a silica PLC hybridization),
- no need to use complex and power consuming electronic feedback loop,
- a simple technological process with only two epitaxial growths,
- it can be used for covering large distances (typically at least 100 km) by optimizing the ring resonator steepness slope,
- it can be used to compensate for chromatic dispersion by exploiting the ring resonator negative dispersion in particular around its critical coupling conditions,
- in the case of a monolithical integration, a change of operation temperature would affect similarly the effective index of the ring resonator and of the laser, keeping the detuning between the laser wavelength and the ring resonance constant. As such, it is expected to maintain the optimized transmission performances even for uncooled operation.

It should be appreciated by those skilled in the art that any block diagram herein represent conceptual views of illustrative circuitry embodying the principles of the invention.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. Emitting device for delivering photons with a chosen wavelength, said emitting device comprising:
   i) an InP substrate with a directly modulated laser arranged for generating photons modulated by a non-return-to-zero modulation to produce data to be transmitted, an active structure of the directly modulated laser being epitaxially grown on the InP substrate,
   ii) a passive ring resonator being defined in a passive section of the InP substrate, said passive ring resonator being monolithically integrated with said directly modulated laser by carrying out a p-doped re-growth both in active and passive sections of the InP substrate followed by a hydrogenation of the passive section of the InP substrate for rendering a p-doping of a re-growth inactive, said passive ring resonator having a resonance amongst several ones that is used for filtering a zero level induced by said data modulation, and
   iii) a tuning means arranged along said directly modulated laser and/or around said ring resonator to tune the photon wavelength and/or said ring resonator resonance used for filtering.

2. Emitting device according to claim 1, wherein said ring resonator is butt-joined to said directly modulated laser to reduce insertion losses.

3. Emitting device according to one of claim 1, wherein said tuning means comprises heating electrodes arranged along said directly modulated laser and/or around said ring resonator and defining a Peltier heater.

4. Emitting device according to one of claim 1, wherein said tuning means comprises a controlled phase-shift section defined into said directly modulated laser.

5. Emitting device according to one of claim 1, wherein said directly modulated laser is made of multi-quantum wells or quantum dashes active layers combined with an optimized buried ridge stripe technology.

6. Emitting device according to claim 5, wherein said directly modulated laser has an adiabatic chirp comprised between approximately 1 GHz and 8 GHz.

7. Emitting device according to claim 1, wherein it further comprises a first semiconducting optical amplifier defined inside said ring resonator to modify optical losses and arranged for adjusting an on/off ratio characteristic and a steepness slope characteristic to modify optical losses.

8. Emitting device according to claim 1, wherein it further comprises a passive taper section after said ring resonator.

9. Emitting device according to claim 1, wherein it further comprises an integrated photodiode defined upward said directly modulated laser and arranged for monitoring optical power.

10. Emitting device according to claim 1, wherein it further comprises a second semiconducting optical amplifier defined downward said ring resonator and arranged for compensating optical losses.

11. A process for producing an emitting device comprising the following steps:
   performing an epitaxial growth of an active structure of a directly modulated laser on an InP substrate,
   carrying out a butt-joint in order to allow growth of a passive structure of a passive ring resonator, defining a Bragg array into the active structure of the directly modulated laser in order to define a directly modulated laser of DFB type, defining active and passive bands, a waveguide with a ring shape being part of the passive ring resonator and a waveguide coupling the directly modulated laser to the passive ring resonator, said waveguide being tangent to the passive ring resonator, carrying out a p-doped re-growth both in active and passive sections, defining metallic contacts for the directly modulated laser, defining metallic heating electrodes near the passive ring resonator, performing a hydrogenation of the passive section for rendering a p-doping of a re-growth inactive.

* * * * *